US012580037B1

(12) United States Patent (10) Patent No.: US 12,580,037 B1
Kientz (45) Date of Patent: Mar. 17, 2026

(54) ADAPTABLE CHARGE LOSS SCANNING CADENCE IN A MEMORY SUB-SYSTEM

(71) Applicant: Micron Technology, Inc., Boise, ID (US)

(72) Inventor: Steven Michael Kientz, Westminster, CO (US)

(73) Assignee: Micron Technology, Inc., Boise, ID (US)

(*) Notice: Subject to any disclaimer, the term of this patent is extended or adjusted under 35 U.S.C. 154(b) by 21 days.

(21) Appl. No.: 18/819,530

(22) Filed: Aug. 29, 2024

(51) Int. Cl.
*G11C 29/50* (2006.01)
*G06F 3/06* (2006.01)

(52) U.S. Cl.
CPC ...... *G11C 29/50016* (2013.01); *G06F 3/0619* (2013.01)

(58) Field of Classification Search
CPC ...... G06F 3/0619; G06F 3/0659; G06F 3/064; G06F 3/0679; G06F 3/068; G06F 3/0653; G11C 29/52; G11C 29/50016
See application file for complete search history.

(56) References Cited

U.S. PATENT DOCUMENTS

| | | | | |
|---|---|---|---|---|
| 2022/0164105 A1* | 5/2022 | Nowell | ................. | G06F 3/0659 |
| 2023/0195379 A1* | 6/2023 | Kientz | ................. | G06F 3/0616 |
| | | | | 711/154 |

* cited by examiner

*Primary Examiner* — Shelly A Chase
(74) *Attorney, Agent, or Firm* — Lowenstein Sandler LLP

(57) ABSTRACT

A system includes a memory device and a processing device operatively coupled with the memory device to perform operations including determining to perform a first scan operation on a first block of a plurality of blocks of the memory device; responsive to determining to perform the first scan operation, adding an indication of the first scan operation to a queue of pending scan operations corresponding to scanning the plurality of blocks; determining whether a number of pending scan operations of the queue of pending scan operations satisfies a threshold condition; and responsive to determining that the number of pending scan operations does not satisfy the threshold condition, causing a first subset of scan operations of the queue of pending scan operations to be performed on respective blocks of the plurality of blocks.

20 Claims, 7 Drawing Sheets

600

Determine to perform a first scan operation on a first block of a plurality of blocks of a memory device 601

Responsive to determining to perform the first scan operation, add an indication of the first scan operation to a queue of pending scan operations corresponding to scanning the plurality of blocks 602

Determine whether a number of pending scan operations of the queue of pending scan operations satisfies a threshold condition 603

Responsive to determining that the number of pending scan operations does not satisfy the threshold condition, cause a first subset of scan operations of the queue of pending scan operations to be performed on respective blocks of the plurality of blocks 604

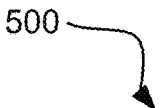

500

```
┌─────────────────────────────────────────────────────────────┐
│   Perform a scan check operation on a memory device 501      │◄┄┄┐
└─────────────────────────────────────────────────────────────┘   ┊
                            │                                      ┊
                            ▼                                      ┊
              Did the scan check                                  ┊
       operation indicate that one or more scan operations        ┊
       are to be performed on respective blocks of the memory     ┊
                      device? 502                                  ┊
                            │                                      ┊
                            ▼                                      ┊
┌─────────────────────────────────────────────────────────────┐   ┊
│ Add one or more indications of the one or more scan          │   ┊
│ operations to a queue of pending scan operations 503         │   ┊
└─────────────────────────────────────────────────────────────┘   ┊
                            │                                      ┊
                            ▼                                      ┊
                 Is a number of scan                              ┊
        operations in the queue of pending scan                   ┊
        operations greater than or equal to a threshold           ┊
                  condition? 504                                   ┊
                            │                                      ┊
                            ▼                                      ┊
┌─────────────────────────────────────────────────────────────┐   ┊
│ Perform a number of scan operations associated with the      │┄┄┤
│ threshold condition on respective blocks of the memory       │   ┊
│ device 505                                                    │   ┊
└─────────────────────────────────────────────────────────────┘   ┊
                                                                   ┊
┌─────────────────────────────────────────────────────────────┐   ┊
│ Perform up to the number of scan operations associated with  │   ┊
│ the threshold condition on respective blocks of the memory   │┄┄┘
│ device 506                                                    │
└─────────────────────────────────────────────────────────────┘
```

FIG. 5

600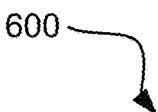

Determine to perform a first scan operation on a first block of a plurality of blocks of a memory device 601

Responsive to determining to perform the first scan operation, add an indication of the first scan operation to a queue of pending scan operations corresponding to scanning the plurality of blocks 602

Determine whether a number of pending scan operations of the queue of pending scan operations satisfies a threshold condition 603

Responsive to determining that the number of pending scan operations does not satisfy the threshold condition, cause a first subset of scan operations of the queue of pending scan operations to be performed on respective blocks of the plurality of blocks 604

FIG. 6

ADAPTABLE CHARGE LOSS SCANNING CADENCE IN A MEMORY SUB-SYSTEM

TECHNICAL FIELD

Embodiments of the disclosure relate generally to memory sub-systems, and, more specifically, relate to implementing adaptable charge loss scanning cadence in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 is a flow diagram of an example method to implement adaptable charge loss scanning cadence in a memory sub-system, according to some aspects of the disclosure.

FIG. 6 is a flow diagram of an example method to implement adaptable charge loss scanning cadence in a memory sub-system, according to some aspects of the disclosure.

DETAILED DESCRIPTION

Figure 1:
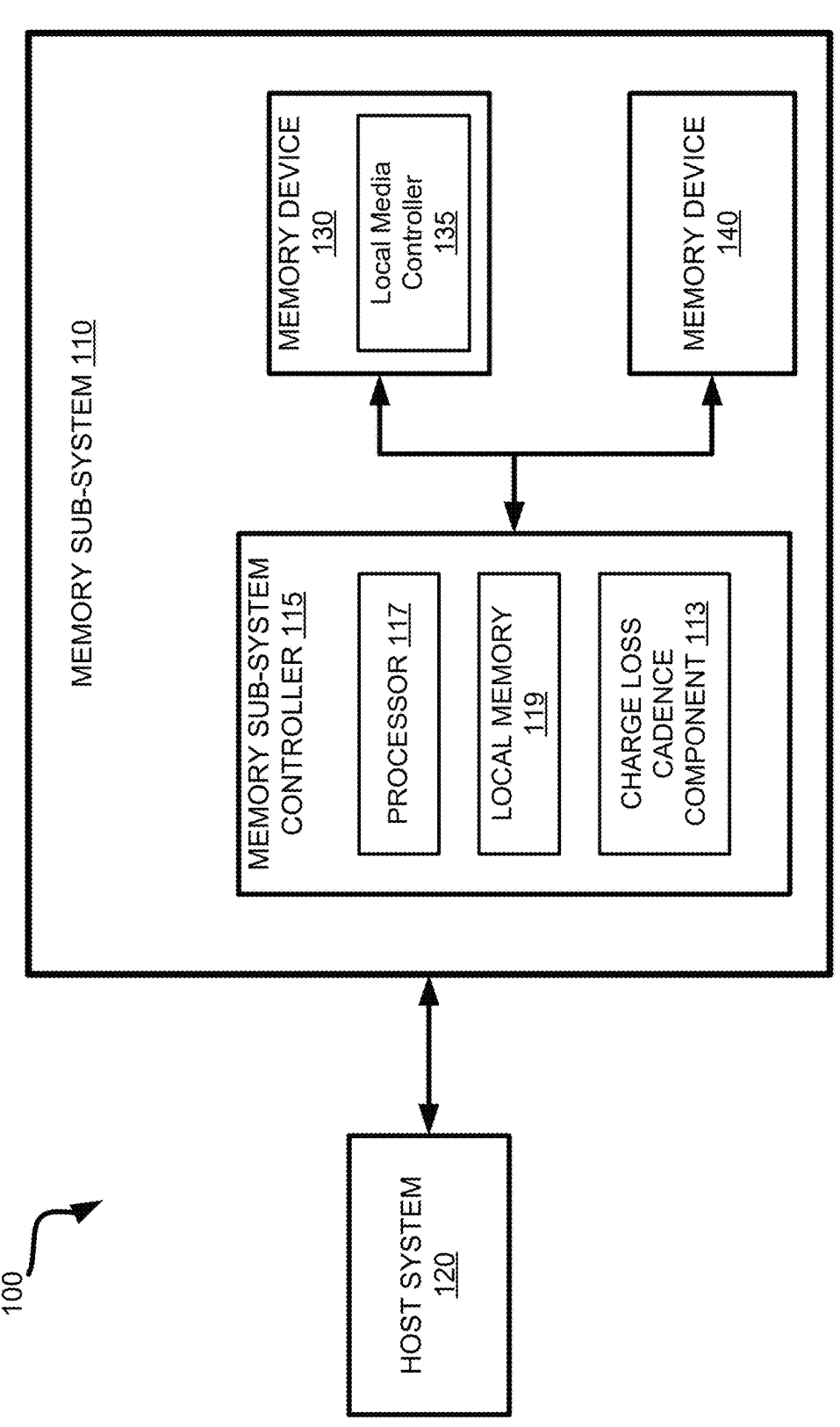
FIG. 1 illustrates an example computing system that includes a memory sub-system, in accordance with some embodiments of the present disclosure.

Aspects of the present disclosure are directed to implementing adaptable charge loss scanning cadence in a memory sub-system. A memory sub-system can be a storage device, a memory module, or a combination of a storage device and a memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high-density non-volatile memory devices where retention of data is desired when no power is supplied to the memory device. One example of a non-volatile memory device is a negative-AND (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can have a row of associated memory cells in a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g., oxide) layer. For example, a 3D memory device can be a 3D replacement gate memory device having a replacement gate structure using wordline stacking.

The memory sub-system can perform host-initiated memory access operations. For example, the host system can initiate a data operation (e.g., write, read, erase, etc.) on a memory sub-system. The host system can send access requests (e.g., write command or read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory cell ("cell") can be programmed (e.g., written to) by applying a certain voltage to the cell, which results in an electric charge being held by the cell. For example, a voltage signal $V_{CG}$ can be applied to a control electrode of the cell to open the cell to the flow of electric current across the cell between a source electrode and a drain electrode. More specifically, for each individual cell (having a charge Q stored thereon), there can be a threshold control gate voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, $P(Q, V_T) = dW/dV_T$, where dW represents the probability that any given cell has its threshold voltage within the interval $[V_T, V_T + dV_T]$ when charge Q is placed on the cell.

A memory device can exhibit threshold voltage distributions $P(Q, V_T)$ that are narrow compared with the working range of control voltages tolerated by the cells of the device. Accordingly, multiple non-overlapping distributions $P(Q_k, V_T)$ ("valleys") can be fit into the working range, allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$. The logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1"), each corresponding to a respective $V_T$ level. For example, the "1" state can be an erased state (L0), and the "0" state can be a programmed state (L1). Another type of cell is a multi-level cell (MLC), which stores 2 bits per cell and defines 4 states ("11" or "L0", "10" or "L1", "01" or "L2" and "00" or "L3"), each corresponding to a respective $V_T$ level. For example, the "11" state can be an erased state, and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7"), each corresponding to a respective $V_T$ level. For example, the "111" state can be an erased state, and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. A memory device can include one or more arrays of memory cells such as SLCs, MLCs, TLCs, QLCS, PLCs, etc., or any combination of such. For example, a memory device can include an SLC portion, an MLC portion, a TLC portion, a QLC portion, or a PLC portion of cells.

A valley margin can also be referred to as a read window. For example, in an SLC cell, there is 1 read window that exists with respect to the 2 $V_T$ distributions. As another example, in an MLC cell, there are 3 read windows that exist with respect to the 4 $V_T$ distributions. As yet another example, in a TLC cell, there are 7 read windows that exist with respect to the 8 $V_T$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

As data is repeatedly written and erased in a memory device, such as a flash memory, the memory device may be more susceptible to errors due to various types of noise and disturb mechanisms inherent within the memory cell, which may be exacerbated with repeated programming. As a result, the raw bit error rates (RBERs) for the memory device can increase over time. Given this pattern, the end-of-life RBERs for these devices are much higher as compared to the beginning-of-life RBERs for the respective devices.

To address read errors, a memory sub-system can use an error handling technique to correct errors and verify that the data written into the memory device is the same as the data being read from the respective memory device. In some embodiments, the error handling technique can include performing one or more read retries using different parameters, such as a change in the threshold voltage offset as compared to the initial threshold voltage offset applied in performing a read operation on a set of memory cells.

One phenomenon observed in memory devices is slow charge loss (SCL), which can occur as a function of elapsed time since programming and/or temperature. SCL (also referred to herein as "charge loss") can cause a $V_T$ distribution shift, in which $V_T$ distributions shift towards lower voltage levels. That is, the $V_T$ distribution shift can be proportional to the elapsed time from a programming operation to a read operation and/or temperature. The $V_T$ distribution shift changes rapidly at first (e.g., immediately after the memory cell was programmed), and then slows down in an approximately logarithmic linear fashion with respect to the time elapsed since programming. Charge loss and the corresponding $V_T$ distribution shift can, over time, lead to increasing bit error rates (e.g., raw bit error rates (RBERs)) that require increasing amounts of error correction to address, and, accordingly, increasing amounts of system resources.

Depending on the system workload and program-erase cycles, the elapsed times since programming may vary across blocks. These variations in the elapsed time since programming can result in varying, non-uniform $V_T$ distribution shifts of respective blocks if the programming of blocks is spaced significantly in time. As a result of these non-uniform $V_T$ distribution shifts, it can be difficult to predict an optimal threshold voltage offset that needs to be applied to the majority of the blocks across wordlines to address charge loss without compromising performance.

In some implementations, the charge loss can be tracked by implementing the block family error avoidance (BFEA), which involves assigning each block of a memory device to a respective predefined block family (BF). Each BF can define a grouping of blocks having a substantially similar elapsed time since programming (e.g., are programmed at or around the same time). In some implementations, the grouping of blocks in a BF can have a substantially similar programming temperature (e.g., are programmed at or around the same temperature of the memory device). Each BF can be assigned to a respective threshold voltage offset bin ("bin"), where each BFEA bin includes a set of threshold level offsets to be applied to respective programming voltage levels to account for $V_T$ distribution shifts over time (and temperature changes) resulting from the slow charge loss. As mentioned above, the amount of charge loss of a block can be a function of the elapsed time from a programming operation and/or temperature. Each BFEA bin can be assigned a respective bin index representing a bin number.

In some implementations, a new block family can be created whenever a specified period of time (e.g., a predetermined duration) has elapsed since the creation of a previous block family—regardless of the number of blocks grouped into the previous block family. In some implementations, a new block family can be created whenever a temperature of the memory device changes by a specified threshold value (e.g., a predetermined change in temperature), regardless of the number of blocks in a previous block family (e.g., the block family prior to the creation of the new block family due to the change in temperature).

When a block is first programmed at time 0, the block can be initially assigned to the currently open BF, where the currently open BF is associated with a first bin (e.g., bin_0). A media scan operation (also referred to herein as a "scan operation") can be performed on representative blocks of each BF at a particular respective $V_T$ level periodically (e.g., hourly, daily, etc.) to determine whether the threshold voltage offset for a block, and thus the BFEA bin assignment, should be updated to better track $V_T$ distribution shift over time. For example, if the media scan operation indicates that the threshold voltage offset should be updated to the threshold voltage offset assigned to a second bin (e.g., bin 1), then the block family can be reassigned to the second bin.

As discussed above charge loss can be tracked and thus mitigated by implementing BFEA. When a charge loss value associated with a BF exceeds a charge loss threshold (e.g., also referred to herein as a "bin exit threshold") for the bin to which the BF is currently assigned, the memory device can reassign the BF to a new bin. In this way, memory operations can be performed on blocks of a BF using memory operation parameters associated with the currently assigned bin, leading to fewer memory operation errors. As described above, charge loss can be tracked for a BF by performing a media scan operation. Regular media scan operations cause a BF to be reassigned to a new bin (as applicable) at a consistent rate. Due to the progressive nature of charge loss, media scan operations are often performed more frequently on first bins (e.g., bins assigned shortly after programming a BF) where charge loss occurs more rapidly, and less frequently on later bins (e.g., bins associated with a longer time since programming the BF). Occasionally, media scan operations for a first bin align with media scan operations of a later bin. For example, bin_0 can be scanned on a 10-minute interval, bin_1 can be scanned on a 20-minute interval, and bin_2 can be scanned on a 30-minute interval. Thus, at each 60-minute interval, the memory device would scan for bin_0, bin_1, and bin_2. With increasing numbers of bins, N, in a worst-case scenario, N-number of bins would be scanned, which can impede the performance of the memory device.

Aspects of the present disclosure address the above and other deficiencies by implementing an adaptable charge loss scanning cadence in a memory sub-system. At a regular interval, the memory sub-system determines which bins are to be scanned for block families that have exceeded a bin threshold. If a particular bin is to be scanned, the memory operation associated with scanning that particular bin is added to a queue of pending scan operations. Each time the sub-system checks for bins to scan (e.g., at the regular interval) a certain number of scan operations from the queue of pending scan operations are performed. Pending scan operations that are not performed remain on the queue, and at the next check (e.g., after another duration of the regular interval) another certain number of scan operations are performed. In this way, a maximum number of scan operations performed at any given time (e.g., a worse-case scenario) is limited to the certain number of scan operations that are performed from the queue of pending scan operations.

Advantages of the present disclosure include improved memory device performance and reliability. For example, embodiments described herein can improve consistency of memory device activity by reducing the potential for spikes in memory device activity, which may otherwise use up bandwidth of the memory device. Additionally, embodiments described herein can achieve improved performance consistency across charge loss conditions. Accordingly, embodiments described herein can be implemented to reduce read errors and increase the life of a memory device.

The method can be implemented with any suitable memory device architecture in accordance with the embodiments described herein. In one embodiment, the method can be implemented with a memory device implementing replacement gate NAND (RG NAND) technology. A replacement gate (RG) NAND device is a NAND device that implements a RG architecture rather than a floating gate (FG) architecture. The RG NAND architecture removes cell gaps that are typically found in FG NAND architectures, thereby reducing or eliminating capacitance resulting from those cell gaps. More specifically, the RG NAND architecture corresponds to a single-insulator structure. The RG NAND architecture can enable smaller size, improved read and write latency, and an increase in transfer rate as compared to the FG NAND architecture. Further details regarding implementing adaptive block family error avoidance (BFEA) in a memory sub-system will be described below with reference to FIGS. 1-8.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe or CXL bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-AND (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level memory cells (SLC), can store one bit per memory cell. Other types of memory cells, such as multi-level memory cells (MLCs), triple-level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application-specific integrated circuit (ASIC), etc.), or another suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control the operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system controller 115 can implement a charge loss temperature component 113. The charge loss temperature component 113 determine a current temperature value of the memory device 130, and a measured charge loss value for a BF of the memory device 130. The charge loss temperature component 113 can use the current temperature value and the measured charge loss value for the BF to generate a normalized charge loss value. In some embodiments, the normalized charge loss value is generated using a predetermined table of characterized values. The predetermined table includes various temperature values associated with a respective charge loss adjustment value in relation to a charge loss value for a reference temperature. The charge loss temperature component 113 can report the normalized charge loss value in place of the measured charge loss value, and the normalized charge loss value can be used to perform memory operations on the memory device 130. In some embodiments, BFEA is implemented in the memory device 130 and the memory operation is a media scan operation to determine a bin assignment for a particular block family (e.g., based on a determined charge loss value associated with the block family). Further details regarding the operations of the charge loss temperature component 113 will be described below with reference to FIGS. 4A-6.

Figure 2:
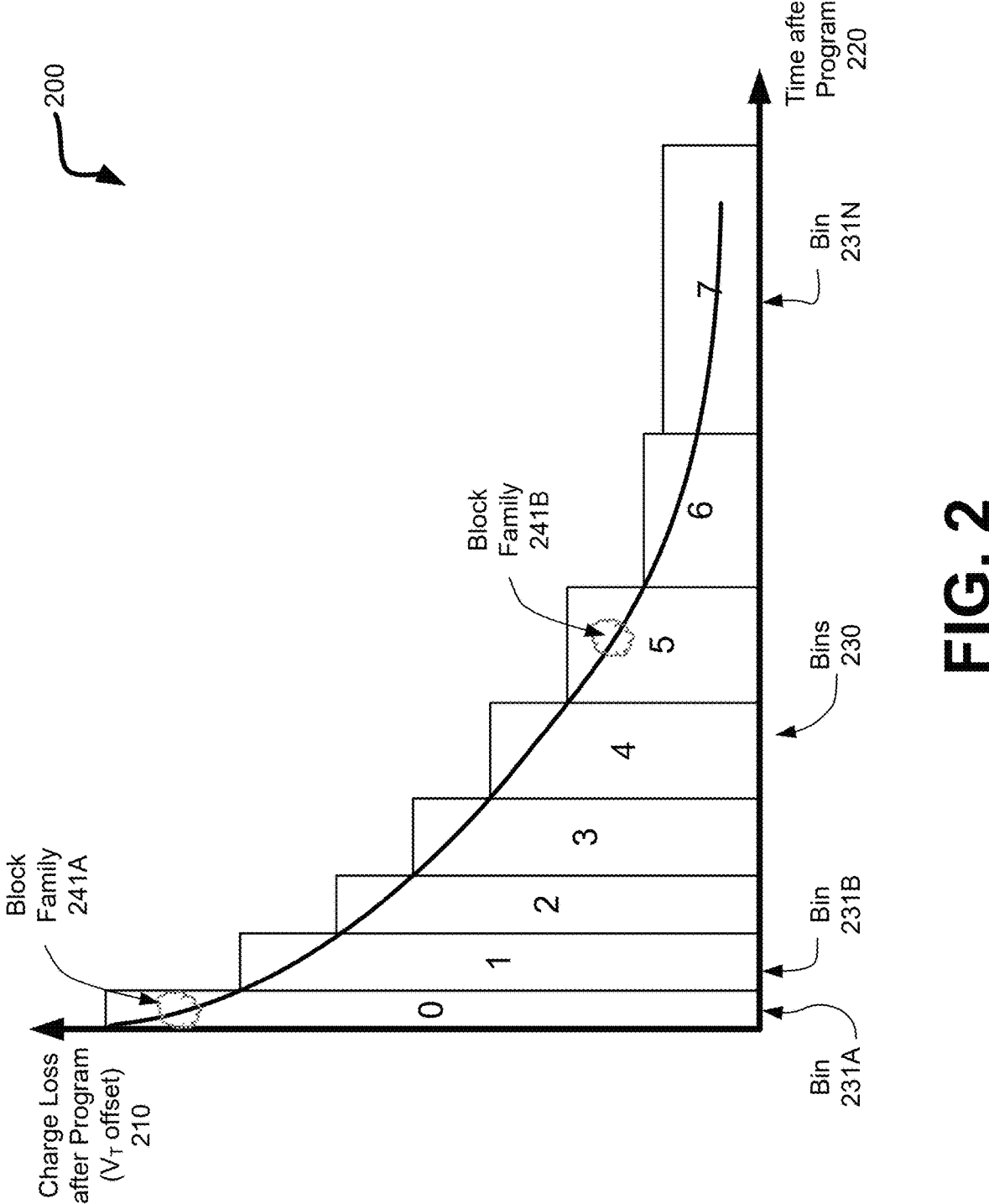
FIG. 2 depicts an example graph, illustrating the dependency of charge loss after program ($V_T$ offset) on the time after program (i.e., the period of time elapsed since the block has been programmed), according to with some aspects of the disclosure.

FIG. 2 depicts an example graph 200, illustrating the dependency of charge loss after program ($V_T$ offset) 210 on the time after program 220 (i.e., the period of time elapsed since the block has been programmed), according to with some aspects of the disclosure. Graph 200 can be subdivided into multiple bins 230 (shown as bin 231A, bin 231B, and bin 231N) corresponding to time after program 220. Each bin (e.g., bin 231A, etc.) corresponds to a predetermined range of threshold voltage offsets 210. While the illustrative example of FIG. 2 defines 8 bins, in other embodiments, other numbers of bins can be defined (e.g., 4 bins, 64 bins, etc.).

Blocks of the memory device are grouped into block families, such as block family 241A and block family 241B. A block family can include one or more blocks that have been programmed within a specified time window and/or a specified temperature window. As noted herein above, since the time elapsed after programming and temperature are the main factors affecting the TVS (e.g., the voltage shift), blocks and/or partitions within a single block family (such as block family 241A or block family 241B) are presumed to exhibit similar distributions of threshold voltages in memory cells, and thus would require the same voltage offsets for read operations.

Block families can be created asynchronously with respect to block programming events. Over time and/or with changes in temperature, the $V_T$ distribution of block family 241A can move closer to the $V_T$ distribution of block family 241B currently shown in TAP bin 5. For example, the memory subsystem controller (such as memory sub-system controller 115 as described with respect to FIG. 1) can create a new block family whenever a specified period of time (e.g., a predetermined number of minutes) has elapsed since creation of the last block family. Additionally, or alternatively, the memory sub-system controller (such as memory sub-system controller 115 as described with respect to FIG. 1) can create a new block family whenever the reference temperature of memory cells has changed by more than a specified threshold value since creation of the current block family. In some embodiments, the reference temperature of memory cells can be updated at specified time intervals, and/or in response to a triggering event.

A newly created block family, such as block family 241A, can be associated with bin 0. Based on a periodically performed calibration process, the memory sub-system controller (such as memory sub-system controller 115 as described with respect to FIG. 1) associates each block family (e.g., such as block family 241A, or block family 241B) with a TAP bin (e.g., a voltage offset bin). A TAP bin defines a set of voltage offsets to be applied to the base voltage read level in order to perform read operations, as described in more detail herein below. The associations of blocks with block families, as well as the associations of block families with Bins, can be stored in respective metadata tables maintained by the memory sub-system controller. In some embodiments, the associations of blocks with block families and/or the associations of block families with Bins can be stored in one or more BFEA tables.

Figure 3:
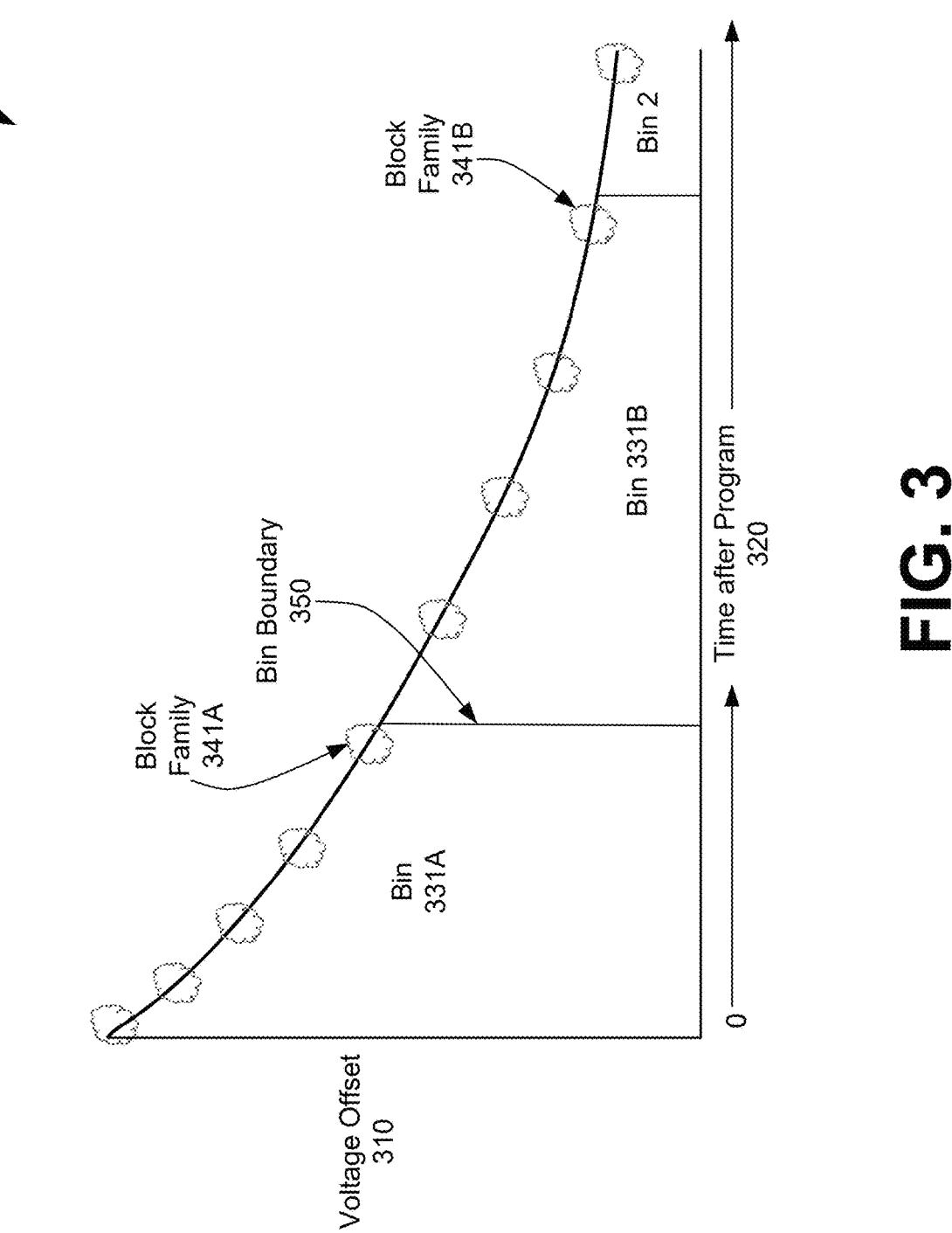
FIG. 3 schematically illustrates selecting block families for calibration, according to some aspects of the disclosure.

FIG. 3 schematically illustrates block family calibration selection 300, according to some aspects of the disclosure. The memory sub-system controller (such as memory subsystem controller 115 as described with respect to FIG. 1) can perform the calibration operations on one of the oldest block families in each bin (e.g., the block family having the longest time after program 320 value, and thus the lowest voltage offset 310 value of the bin). As illustratively exemplified, the memory sub-system controller can perform calibration operations on block family 341A in bin 331A and block family 341B in bin 331B, since each are the oldest block family that will, due to slow charge loss, migrate across bin boundary 350 (e.g., a predetermined bin voltage boundary) to the next bin before any other block family of each current respective bins.

Figures 4A, 4B:
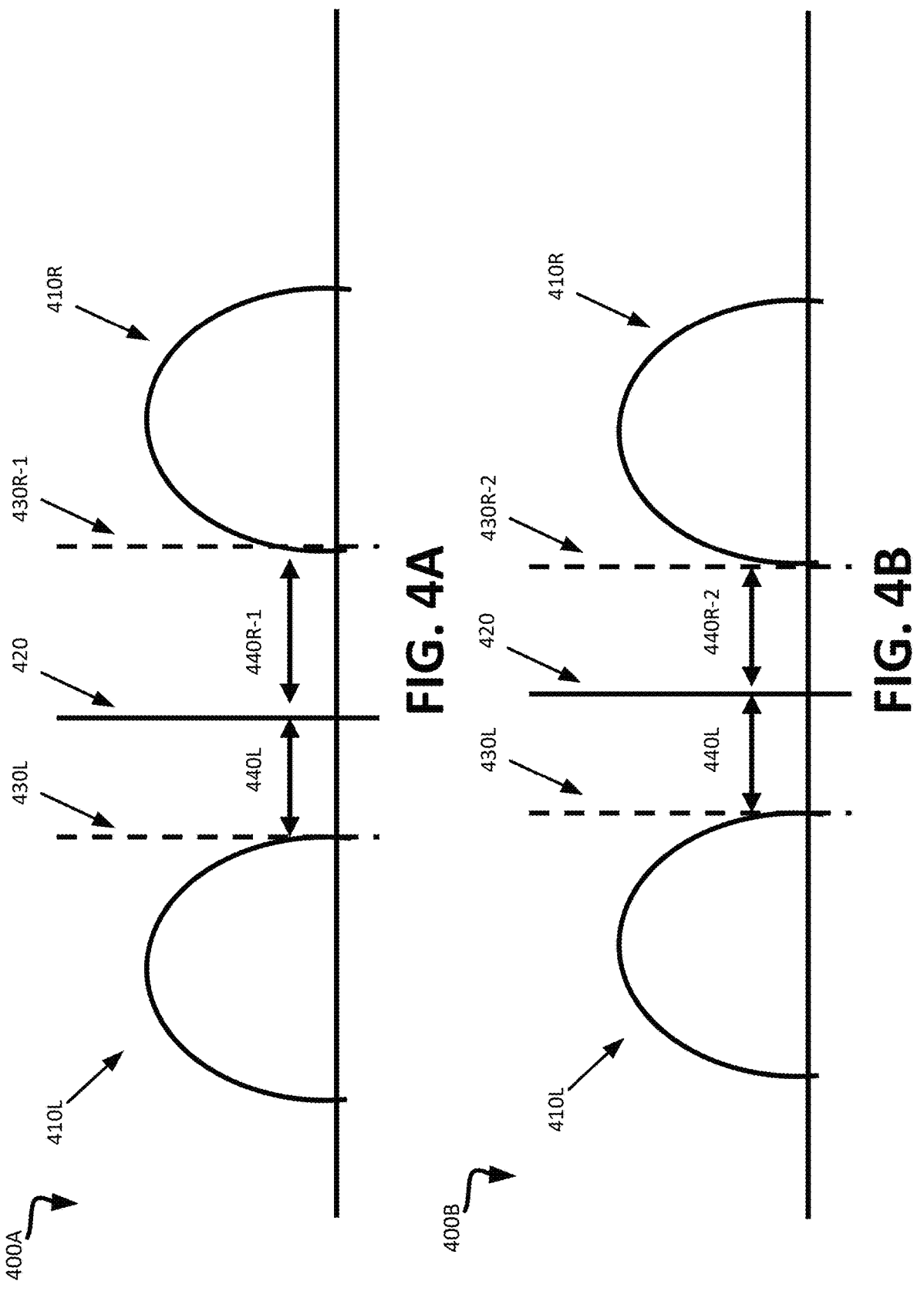
FIGS. 4A-4B are diagrams of $V_T$ distributions illustrating an example implementation of adaptive block family error avoidance (BFEA) in a memory sub-system, according to some aspects of the disclosure.

FIGS. 4A-4B are diagrams of $V_T$ distributions illustrating an example implementation of adaptive block family error avoidance (BFEA) in a memory sub-system, according to some aspects of the disclosure. For example, FIG. 4A illustrates a diagram 400A of a left $V_T$ distribution 410L and a right $V_T$ distribution 410R at a first time. For example, the first time can be the time of programming (e.g., time 0). A center read level 420 can exist in the valley between the $V_T$ distributions 410L and 410R. The valley defines a read window. A boundary 430 L can be identified for the left $V_T$ distribution 410L and a boundary 430R-1 can be identified for the right $V_T$ distribution 410R. The distance between the center read level 420 and the boundary 430L defines a left portion of the read window 440L. The boundaries 440L-1 and 440R-1 can each be identified from a threshold bit error rate (e.g., RBER). The boundaries 440L-1 and 440R-1 can be identified empirically by analyzing charge loss after memory device manufacture. A distance between the center read level 420 and the boundary 440R-1 defines a right portion of the read window 440R-1.

FIG. 4B illustrates a diagram 400B of the left $V_T$ distribution 410L and the right $V_T$ distribution 410R at a second time after the first time. Due to charge loss that occurred between the first time and the second time, at least the right $V_T$ distribution 410R shifted to the left. If the boundary 430R-1 from FIG. 4A remains at the same position, this would result in a bit error rate that exceeds the threshold bit error rate. Thus, to address the shift of the right $V_T$ distribution 410R caused by the charge loss, the boundary 430R-1 is updated to boundary 430R-2, which results in an updated distance between the center read level 420 and the boundary 430R-2 defining a right portion of the read window 440R-2. The updated distance is smaller than the previous distance, and thus the right portion of the read window 440R-2 is smaller than the right portion of the read window 440R-1. Moreover, the read window itself has been reduced due to the shift of the right $V_T$ distribution 410R.

FIG. 5 is a flow diagram of an example method 500 to implement adaptable charge loss scanning cadence in a memory sub-system, according to some aspects of the disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the charge loss temperature component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 501, the processing logic performing the method 500 performs a scan check operation on a memory device. In some embodiments, the scan check operation determines a number of scan operations to be performed on the memory device. In some embodiments, the scan check operation determines whether a scan operation is to be performed on a respective block. The scan operation can be performed to determine a charge loss value for the block. In some embodiments, the block is a representative block of a block family assigned to a particular bin. The bin may define a respective grouping of block families based on respective charge loss values. In some embodiments, the scan check operation determines, for each bin, whether a scan operation is to be performed on a representative block associated with the respective bin.

Each scan operation corresponding to a respective bin can be associated with a respective duration between scanning. For example, and in some embodiments, a first scan operation for a first bin can be associated with a first duration between the first scan operations. In another example and in some embodiments, a second scan operation for a second bin can be associated with a second duration between the second scan operations, and so forth, through an Nth scan operation for an Nth bin associated with an Nth duration between the Nth scan operations.

In some embodiments, the scan check operation is performed at a regular interval (e.g., a scan cadence). At each scan cadence (e.g., a duration since a previous scan check operation has been performed), the scan check operation is performed at the memory device. In some embodiments, the scan cadence is less than a first duration between first scan operations, described in the previous paragraph. In some embodiments, the scan cadence is the same as the first duration between the first scan operations. In some embodiments where the scan cadence is the same as the first duration between the first scan operations, the scan check operation may include performing the first scan operation, followed by operations 502-506, below.

At operation 502, the processing logic determines whether the scan check operation indicated that one or more scan operations are to be performed on respective blocks of the memory device. If the scan check operation indicates that no scan operations are to be performed, the processing logic proceeds to operation 506. If the scan check operation indicates that one or more scan operations are to be performed, the processing logic proceeds to operation 503.

At operation 503, responsive to determining the scan check operation indicated that one or more scan operations are to be performed, the processing logic adds one or more indications of the one or more scan operations to a queue of pending scan operations. The queue of pending scan operations can be carried over between scan check operations. For example, a first scan check operation may indicate that three scan operations are to be performed, each of which is added to the queue of pending scan operations. After scan operations are performed from the queue, one scan operation may still remain (added from the first scan check operation). A second scan check operation may indicate that four scan operations are to be performed, each of which is added to the queue of pending scan operations (which now contains a first scan operation added from the first scan check operation, and three additional scan operations added from the second scan check operation).

At operation 504, the processing logic determines whether a number of scan operations in the queue of pending scan operations is greater than or equal to a threshold condition. The threshold condition can reflect a maximum number of scan operations that are performed each time a scan check is performed (e.g., at the predetermined scanning cadence). In some embodiments, the maximum number of scan operations performed at each scan check is predetermined during production of the memory device. In some embodiments, the maximum number of scan operations performed at each scan check may be configured based on one or more operating conditions after the memory device has been deployed and is in operation.

At operation 505, responsive to determining the number of scan operations in the queue of pending scan operations is greater than or equal to the threshold condition, the processing logic performs a number of scan operations associated with the threshold condition on respective blocks of the memory device. As described above, the number of scan operations associated with the threshold condition can be a maximum number of scan operations to be performed at each scan check. In some embodiments, the threshold condition can be selected based on one or more characteristics of the memory device, including an intended use of the memory device (e.g., application specific), a desired reliability of the memory device, a desired maximum latency of the memory device, a bandwidth of the memory device, a number or type or frequency of additional memory operations (e.g., background memory operations) performed at the memory device, or the like.

At operation 506, responsive to determining the scan check operation did not indicate that one or more memory operations are to be performed, or responsive to determining that a number of scan operations in the queue of pending scan operations is not greater than or equal to the threshold condition, the processing logic performs up to the number of scan operations associated with the threshold condition on respective blocks of the memory device. That is, the processing logic performs all scan operations on the queue of pending scan operations, as the number of scan operations on the queue is less than the number of scan operations associated with the threshold condition.

FIG. 6 is a flow diagram of an example method 600 to implement adaptable charge loss scanning cadence in a memory sub-system, according to some aspects of the disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the charge loss temperature component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 601, the processing logic performing the method 600 determines to perform a first scan operation on a first block of a plurality of blocks of a memory device. In some embodiment, determining to perform the first scan operation includes determining that a first duration has elapsed since a previous scan operation was performed on the first block. In some embodiments, the first duration represents a duration between when a previous first scan operation was performed and a subsequent first scan operation is to be performed. In some embodiments, the first duration corresponds to a scanning cadence. The processing logic can determine a duration associated with a scanning cadence has elapsed since one or more previous scan operations were performed. Responsive to determining the scanning cadence has elapsed, the processing logic can determine (i) whether to perform the first scan operation based on the first duration, and (ii) whether to perform a second scan operation based on a second duration. In some embodiments, the scanning cadence is different from the first duration. In some embodiments, the first duration is longer than the scanning cadence. In some embodiments, the second duration is longer than the second duration. In some embodiments, additional scanning operations (e.g., through Nth scanning operations, corresponding to Nth respective blocks) can be associated with Nth durations.

At operation 602, responsive to determining to perform the first scan operation, the processing logic adds an indication of the first scan operation to a queue of pending scan operations corresponding to scanning the plurality of blocks. In some embodiments, the processing logic can further determine to perform a second scan operation on a second block of the memory device. The second scan operation can correspond to a second duration that is different from a first duration associated with the first scan operation. In some embodiments, the indication of the first scan operation and the indication of the second scan operation are added to the queue together. As described below, scan operations may be performed using the queue, however the first scan operation and the second scan operation may be performed separately.

At operation 603, the processing logic determines whether a number of pending scan operations of the queue of pending scan operations satisfies a threshold condition. In some embodiments, the number of pending scan operations satisfies the threshold condition if the number of pending scan operations is less than a predetermined maximum number of scan operations that are to be performed together. Conversely, the number of pending scan operations does not satisfy the threshold condition if the number of pending scan operations is greater than or equal to the predetermined maximum number of scan operations.

At operation 604, responsive to determining the number of pending scan operations does not satisfy the threshold condition, the processing logic causes a first subset of scan operations of the queue of pending scan operations to be performed on respective blocks of the plurality of blocks. The first subset of scan operations can be a number of scan operations equal to the predetermined maximum number of scan operations. The remaining pending scan operations in the queue are not performed and remain in the queue. For example, if the queue has ten pending scan operations and the predetermined number of scan operations is three scan operations, then the number of pending scan operations (e.g., ten scan operations) does not satisfy the threshold condition (e.g., is greater than or equal to three). Thus, a first subset of scan operations are performed (e.g., three scan operations) because the number of pending scan operations on the queue (i.e., ten scan operations) exceeds the predetermined maximum number of scan operations that may be performed (i.e., three scan operations).

In some embodiments, responsive to determining that the number of pending scan operations satisfies the threshold condition, the processing logic causes the set of pending scan operations to be performed on respective blocks of the plurality of blocks. That is, all scan operations on the queue of pending scan operations are performed. For example, if the queue has two pending scan operations and the predetermined number of scan operations is three scan operations, then the number of pending scan operations (i.e., two scan operations) satisfies the threshold condition (e.g., is less than three). Thus, the number of pending scan operations (i.e., two scan operations) are performed because the number of pending scan operations on the queue (i.e., two can operations) is less than the maximum number of scan operations that may be performed (i.e., three scan operations).

In some embodiments, the first scan operation includes additional sub-operations. The processing logic can determine a charge loss value for the first block. The processing logic can further indicate a label for the first block based on the charge loss value of the first block (e.g., the charge loss value associated with the first block). For example, the processing logic can identify and assign a logical assignment (e.g., label) for the block based on the charge loss value.

In some embodiments, the block to be scanned (e.g., the first block) is a representative block for a first block family of a plurality of block families. The processing logic can determine, using the first block, a first charge loss value associated with the first block family. The processing logic can further determine whether the first charge loss value satisfies a first charge loss threshold value. For example, a bin exit threshold (e.g., a value at which the block family is reassigned to a new bin based on the charge loss value associated with the block family). Responsive to determining the first charge loss value satisfies the charge loss threshold condition, the processing logic can reassign the first block family from a first bin associated with the memory device to a second bin associated with the memory device. As described above, and in some embodiments, a bin can define a respective grouping of block families based on respective charge loss values.

Figure 7:
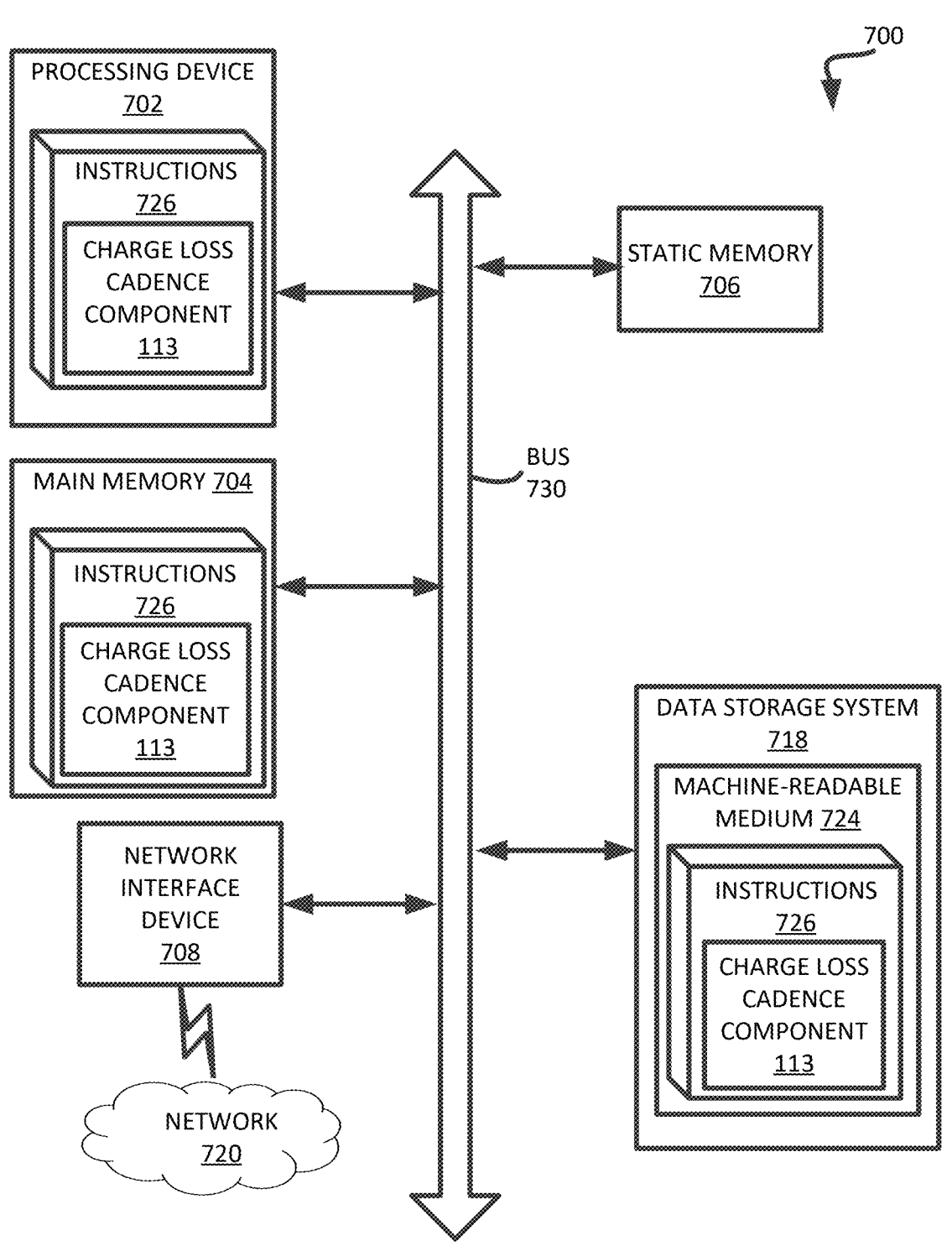
FIG. 7 is a block diagram of an example computer system in which embodiments of the present disclosure may operate.

FIG. 7 illustrates an example of a computer system 700 within which a set of instructions, for causing the machine to perform any one or more of the methodologies discussed herein, can be executed, in accordance with aspects of the disclosure. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory operation metadata component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

In some embodiments, computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable non-transitory storage medium) on which is stored one or more sets of instructions 726 or software embodying any one or more of the methodologies or functions described herein. In some embodiments, the data storage system 718 can include a computer-readable non-transitory storage medium, and can be operatively coupled to the processing device 702. The instructions 726 can also reside, completely or at least partially, within the main memory 704 and/or within the processing device 702 during execution thereof by the computer system 700, the main memory 704 and the processing device 702 also constituting machine-readable storage media. In some embodiments, the instructions 726 can be refer to executable instructions. The machine-readable storage medium 724, data storage system 718, and/or main memory 704 can correspond to the memory sub-system 110 of FIG. 1.

In some embodiments, the instructions 726 include instructions to implement functionality corresponding to the memory operation metadata component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system comprising:
    a memory device; and one or more processing devices operatively coupled to the memory device, the one or more processing devices to perform operations comprising:
    determining to perform a first scan operation on a first block of a plurality of blocks of the memory device;
    responsive to determining to perform the first scan operation, adding an indication of the first scan operation to a queue of pending scan operations corresponding to scanning the plurality of blocks;
    determining whether a number of pending scan operations of the queue of pending scan operations satisfies a threshold condition; and
    responsive to determining that the number of pending scan operations does not satisfy the threshold condition, causing a first subset of scan operations of the queue of pending scan operations to be performed on respective blocks of the plurality of blocks.

2. The memory sub-system of claim 1, the operations further comprising:
    responsive to determining that the number of pending scan operations satisfies the threshold condition, causing the number of pending scan operations to be performed on respective blocks of the plurality of blocks.

3. The memory sub-system of claim 1, wherein determining to perform the first scan operation comprises determining that a first duration has elapsed since a previous scan operation was performed on the first block.

4. The memory sub-system of claim 1, the operations further comprising:
    determining to perform a second scan operation on a second block of the plurality of blocks, wherein the first scan operation corresponds to a first duration and the second scan operation corresponds to a second duration, and wherein the first duration is different than the second duration; and
    responsive to determining to perform the second scan operation, adding the second scan operation to the queue of pending scan operations, wherein the first subset of scan operations comprises the first scan operation.

5. The memory sub-system of claim 1, wherein the first scan operation comprises:
    determining a charge loss value of the first block; and
    indicating a label for the first block based on the charge loss value of the first block.

6. The memory sub-system of claim 1, wherein the first block is a representative block for a first block family of a plurality of block families, the operations further comprising:
    determining, using the first block, a first charge loss value associated with the first block family;
    determining whether the first charge loss value satisfies a first charge loss threshold condition; and
    responsive to determining the first charge loss value satisfies the charge loss threshold condition, reassigning the first block family from a first bin of a plurality of bins associated with the memory device to a second bin of the plurality of bins, wherein each bin of the plurality of bins defines a respective grouping of block families based on respective charge loss values.

7. The memory sub-system of claim 1, further comprising:
    determining a scanning cadence has elapsed since one or more previous scan operations were performed; and
    responsive to determining the scanning cadence has elapsed, determining (i) whether to perform the first scan operation based on a first duration, and (ii) whether to perform a second scan operation based on a second duration, wherein the scanning cadence is different from the first duration, and wherein the second duration is longer than the first duration.

8. A method comprising:

determining to perform a first scan operation on a first block of a plurality of blocks of a memory device;

responsive to determining to perform the first scan operation, adding an indication of the first scan operation to a queue of pending scan operations corresponding to scanning the plurality of blocks;

determining whether a number of pending scan operations of the queue of pending scan operations satisfies a threshold condition; and responsive to determining that the number of pending scan operations does not satisfy the threshold condition, causing a first subset of scan operations of the queue of pending scan operations to be performed on respective blocks of the plurality of blocks.

9. The method of claim 8, the method further comprising:

responsive to determining that the number of pending scan operations satisfies the threshold condition, causing the number of pending scan operations to be performed on respective blocks of the plurality of blocks.

10. The method of claim 8, wherein determining to perform the first scan operation comprises determining that a first duration has elapsed since a previous scan operation was performed on the first block.

11. The method of claim 8, the method further comprising:

determining to perform a second scan operation on a second block of the plurality of blocks, wherein the first scan operation corresponds to a first duration and the second scan operation corresponds to a second duration, and wherein the first duration is different than the second duration; and responsive to determining to perform the second scan operation, adding the second scan operation to the queue of pending scan operations, wherein the first subset of scan operations comprises the first scan operation.

12. The method of claim 8, wherein the first scan operation comprises:

determining a charge loss value of the first block; and indicating a label for the first block based on the charge loss value of the first block.

13. The method of claim 8, wherein the first block is a representative block for a first block family of a plurality of block families, the method further comprising:

determining, using the first block, a first charge loss value associated with the first block family;

determining whether the first charge loss value satisfies a first charge loss threshold condition; and responsive to determining the first charge loss value satisfies the charge loss threshold condition, reassigning the first block family from a first bin of a plurality of bins associated with the memory device to a second bin of the plurality of bins, wherein each bin of the plurality of bins defines a respective grouping of block families based on respective charge loss values.

14. The method of claim 8, the method further comprising:

determining a scanning cadence has elapsed since one or more previous scan operations were performed; and responsive to determining the scanning cadence has elapsed, determining (i) whether to perform the first scan operation based on a first duration, and (ii) whether to perform a second scan operation based on a second duration, wherein the scanning cadence is different from the first duration, and wherein the second duration is longer than the first duration.

15. A computer-readable non-transitory storage medium comprising instructions, that when read, cause one or more processing devices to perform operations comprising:

determining to perform a first scan operation on a first block of a plurality of blocks of a memory device;

responsive to determining to perform the first scan operation, adding an indication of the first scan operation to a queue of pending scan operations corresponding to scanning the plurality of blocks;

determining whether a number of pending scan operations of the queue of pending scan operations satisfies a threshold condition; and responsive to determining that the number of pending scan operations does not satisfy the threshold condition, causing a first subset of scan operations of the queue of pending scan operations to be performed on respective blocks of the plurality of blocks.

16. The computer-readable non-transitory storage medium of claim 15, the operations further comprising:

responsive to determining that the number of pending scan operations satisfies the threshold condition, causing the number of pending scan operations to be performed on respective blocks of the plurality of blocks.

17. The computer-readable non-transitory storage medium of claim 15, the operations further comprising:

determining to perform a second scan operation on a second block of the plurality of blocks, wherein the first scan operation corresponds to a first duration and the second scan operation corresponds to a second duration, and wherein the first duration is different than the second duration; and responsive to determining to perform the second scan operation, adding the second scan operation to the queue of pending scan operations, wherein the first subset of scan operations comprises the first scan operation.

18. The computer-readable non-transitory storage medium of claim 15, wherein the first scan operation comprises:

determining a charge loss value of the first block; and indicating a label for the first block based on the charge loss value of the first block.

19. The computer-readable non-transitory storage medium of claim 15, wherein the first block is a representative block for a first block family of a plurality of block families, the operations further comprising:

determining, using the first block, a first charge loss value associated with the first block family;

determining whether the first charge loss value satisfies a first charge loss threshold condition; and responsive to determining the first charge loss value satisfies the charge loss threshold condition, reassigning the first block family from a first bin of a plurality of bins associated with the memory device to a second bin of the plurality of bins, wherein each bin of the plurality of bins defines a respective grouping of block families based on respective charge loss values.

20. The computer-readable non-transitory storage medium of claim 15, the operations further comprising:

determining a scanning cadence has elapsed since one or more previous scan operations were performed; and responsive to determining the scanning cadence has elapsed, determining (i) whether to perform the first scan operation based on a first duration, and (ii) whether to perform a second scan operation based on a second duration, wherein the scanning cadence is different from the first duration, and wherein the second duration is longer than the first duration.

* * * * *